(12) United States Patent
Kirby et al.

(10) Patent No.: US 7,498,647 B2
(45) Date of Patent: Mar. 3, 2009

(54) PACKAGED MICROELECTRONIC IMAGERS AND METHODS OF PACKAGING MICROELECTRONIC IMAGERS

(75) Inventors: Kyle K. Kirby, Boise, ID (US); Salman Akram, Boise, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 582 days.

(21) Appl. No.: 10/864,974

(22) Filed: Jun. 10, 2004

(65) Prior Publication Data

US 2005/0275049 A1 Dec. 15, 2005

(51) Int. Cl.
*H01L 21/00* (2006.01)
(52) U.S. Cl. .......................... 257/433; 257/432; 438/48
(58) Field of Classification Search ............. 257/79–84, 257/414–470, 528; 438/48
See application file for complete search history.

(56) References Cited

U.S. PATENT DOCUMENTS

| | | | |
|---|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |

(Continued)

FOREIGN PATENT DOCUMENTS

EP 0 886 323 12/1998

(Continued)

OTHER PUBLICATIONS

U.S. Appl. No. 10/785,466, Kirby.

(Continued)

*Primary Examiner*—Leonardo Andújar
(74) *Attorney, Agent, or Firm*—Dickstein Shapiro LLP

(57) ABSTRACT

Microelectronic imagers, methods for packaging microelectronic imagers, and methods for forming electrically conductive through-wafer interconnects in microelectronic imagers are disclosed herein. In one embodiment, a microelectronic imaging die can include a microelectronic substrate, an integrated circuit, and an image sensor electrically coupled to the integrated circuit. A bond-pad is carried by the substrate and electrically coupled to the integrated circuit. An electrically conductive through-wafer interconnect extends partially through the substrate and is in contact with the bond-pad. The interconnect can include a passage extending partially through the substrate to the bond-pad, a dielectric liner deposited into the passage and in contact with the substrate, a conductive layer deposited onto at least a portion of the dielectric liner, a wetting agent deposited onto at least a portion of the conductive layer, and a conductive fill material deposited into the passage and electrically coupled to the bond-pad.

3 Claims, 8 Drawing Sheets

U.S. PATENT DOCUMENTS

| | | | |
|---|---|---|---|
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,169,319 B1 * | 1/2001 | Malinovich et al. | 257/447 |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,667,551 B2 | 10/2001 | Hanaoka et al. | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,452,266 B1 * | 9/2002 | Iwaya et al. | 257/723 |
| 6,483,652 B2 | 11/2002 | Nakamura | |
| 6,703,310 B2 | 12/2002 | Mashino et al. | |
| 6,503,780 B1 | 1/2003 | Glenn et al. | |
| 6,541,762 B2 | 4/2003 | Knag et al. | |
| 6,560,047 B2 | 5/2003 | Choi et al. | |
| 6,566,745 B1 | 5/2003 | Beyne et al. | |
| 6,603,183 B1 | 8/2003 | Hoffman | |
| 6,778,046 B2 | 8/2003 | Stafford et al. | |
| 6,617,623 B2 | 9/2003 | Rhodes | |
| 6,661,047 B2 | 12/2003 | Rhodes | |
| 6,670,986 B1 | 12/2003 | Ben Shoshan et al. | |
| 6,686,588 B1 | 2/2004 | Webster et al. | |
| 6,864,172 B2 | 4/2004 | Noma et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,791,076 B2 | 9/2004 | Webster | |
| 6,795,120 B2 | 9/2004 | Takagi et al. | |
| 6,797,616 B2 | 9/2004 | Kinsman | |
| 6,946,325 B2 | 9/2004 | Yean et al. | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0029643 A1 * | 2/2005 | Koyanagi | 257/680 |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0236708 A1 | 10/2005 | Farnworth et al. | |
| 2005/0254133 A1 | 11/2005 | Akram et al. | |
| 2005/0275750 A1 * | 12/2005 | Akram et al. | 348/374 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemier.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

US 7,498,647 B2

PACKAGED MICROELECTRONIC IMAGERS AND METHODS OF PACKAGING MICROELECTRONIC IMAGERS

TECHNICAL FIELD

The following disclosure relates generally to microelectronic devices and methods for packaging microelectronic devices. Several aspects of the present invention are directed toward packaging microelectronic imagers that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that they have relatively large footprints and occupy a significant amount of vertical space (i.e., high profiles). The footprint of the imager in FIG. 1 is the surface area of the bottom of the interposer substrate 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Another problem with packaging conventional microelectronic imagers is the manufacturing costs for packaging the dies. Forming the wire-bonds 28, for example, in the imager 1 shown in FIG. 1 can be complex and/or expensive because it requires individual wires between each set of bond-pads and ball-pads. In addition, it may not be feasible to form wire-bonds for the high-density, fine-pitch arrays of some high-performance devices. Therefore, there is a significant need to enhance the efficiency, reliability, and precision of packaging microelectronic imagers.

DETAILED DESCRIPTION

A. Overview

Figure 1:
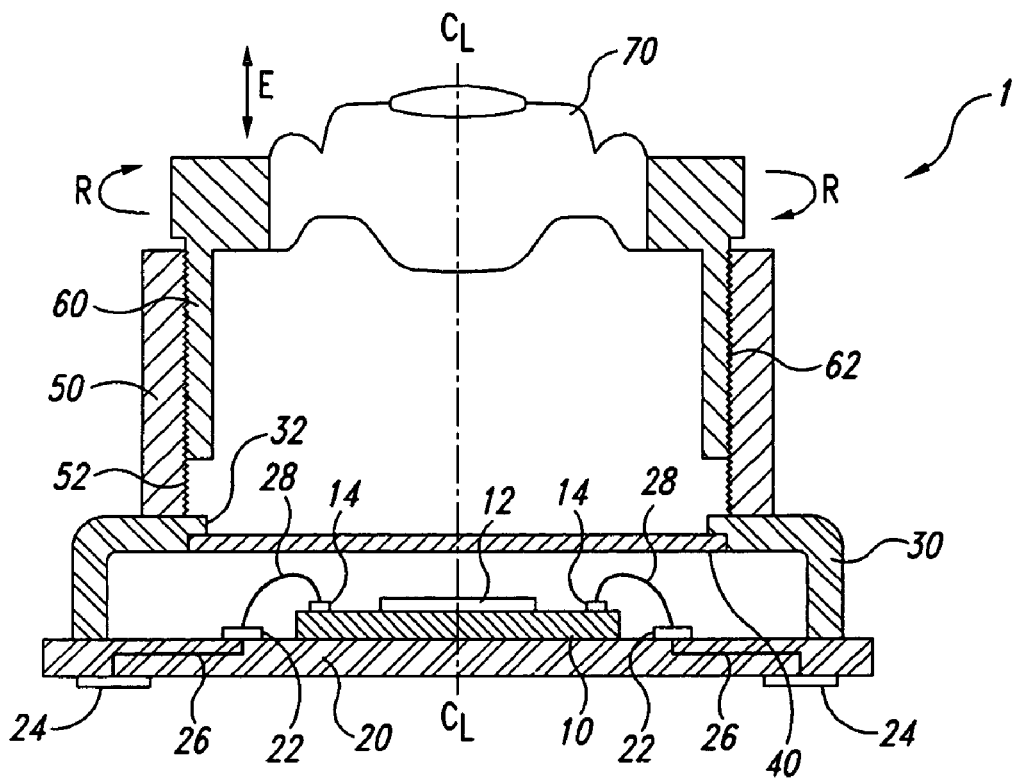
FIG. 1 is a cross-sectional view of a packaged microelectronic imager in accordance with the prior art.

The following disclosure describes several embodiments of microelectronic imagers, methods for packaging microelectronic imagers, and methods for forming electrically conductive through-wafer interconnects in microelectronic imagers. One particular embodiment of the invention is directed toward a microelectronic imaging die comprising a microelectronic substrate, an integrated circuit, and an image sensor electrically coupled to the integrated circuit. The imaging die also includes an electrical terminal (e.g., a bond-pad) electrically coupled to the integrated circuit and a plurality of through-wafer interconnects extending through the substrate. The interconnects contact the backside of corresponding bond-pads to provide an array of electrical contacts on the backside of the die. A plurality of ball-pads can be attached to the backside contacts to form a ball-pad array on the backside of the die.

In one embodiment, the interconnect is formed in a blind hole extending partially through the substrate to the bond-pad. The interconnect can comprise a dielectric liner disposed on the sidewalls of the hole in contact with the substrate. The dielectric liner electrically insulates other components in the substrate from electrical currents transmitted through the interconnect. The interconnect can further include a conductive layer deposited into at least a portion of the hole onto the dielectric liner, and a wetting agent deposited onto at least a portion of the conductive layer. This embodiment of the interconnect further includes a conductive fill material in the hole over the wetting agent. The fill material is electrically coupled to the bond-pad.

Another particular embodiment of the invention is directed toward a method for manufacturing a microelectronic imaging die. The method can include providing a microelectronic substrate having an integrated circuit and an image sensor electrically coupled to the integrated circuit, forming a bond-pad on a substrate, and electrically coupling the bond-pad to the integrated circuit. This method can further include grinding the backside of the substrate to thin the substrate, forming a blind hole or aperture partially through the substrate to expose a portion of the bond-pad, and constructing an interconnect in at least a portion of the hole The interconnect can be constructed by depositing a conductive fill material into at least a portion of the hole to contact the exposed portion of the bond-pad. One particular embodiment of constructing an interconnect includes forming the blind hole through the substrate to the backside of the bond-pad and applying a dielectric liner to at least a portion of the hole. The dielectric liner electrically insulates other components in the substrate from the interconnect that is subsequently formed in the hole. This embodiment of the method further includes depositing a conductive layer onto the dielectric liner in the hole and depositing a wetting agent over at least a portion of the conductive layer. The conductive fill material is then deposited into the hole.

Many specific details of the present invention are described below with reference to microfeature workpieces. The term "microfeature workpiece" as used throughout this disclosure includes substrates upon which and/or in which microelectronic devices, micromechanical devices, data storage elements, read/write components, and other features are fabricated. For example, such microfeature workpieces can include semiconductor wafers (e.g., silicon or gallium arsenide wafers), glass substrates, insulated substrates, and many other types of substrates. The feature sizes in microfeature workpieces can be 0.11 µm or less, but the workpieces can have larger submicron and supra-micron features.

Specific details of several embodiments of the invention are described below with reference to microelectronic imager dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2-6.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

B. Microelectronic Imaging Dies With Through-Wafer Interconnects

Figure 2:
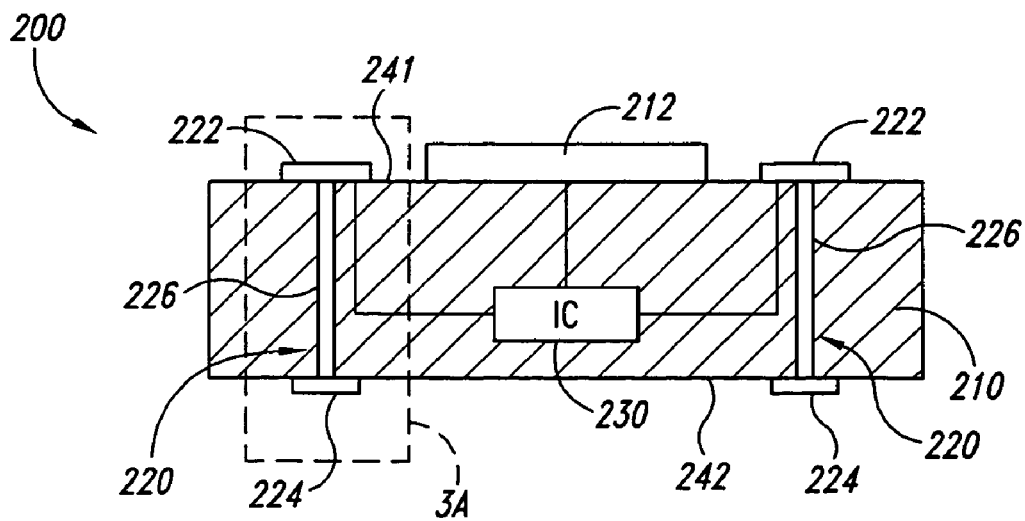
FIG. 2 is a side cross-sectional view schematically illustrating a microelectronic imaging die in accordance with an embodiment of the invention.

FIG. 2 is a side cross-sectional view of a microelectronic imaging die 200 for use in a microelectronic imager in accordance with one embodiment of the invention. In this embodiment, the microelectronic imaging die 200 includes a substrate 210 having a first side 241, a second side 242 opposite the first side, integrated circuitry (IC) 230 within the substrate 210, and an image sensor 212 electrically coupled to the IC 230. The image sensor 212 can be a CMOS device or a CCD for capturing pictures or other images in the visible spectrum. In other embodiments, the image sensor 212 can detect radiation in other spectrums (e.g., IR or UV ranges).

The imaging die 200 further includes a plurality of external contacts 220 for carrying electrical signals. Each external contact 220, for example, can include a bond-pad 222, a ball-pad 224, and an electrically conductive through-wafer interconnect 226 electrically coupling the bond-pad 222 to the ball-pad 224. The external contacts 220 shown in FIG. 2 accordingly provide an array of ball-pads 224 within the footprint of the imaging die 200. The ball-pads 224 can be connected to other external devices such that the imaging die 200 does not need an interposing substrate to be installed on a circuit board.

One advantage of using the through-wafer interconnects 226 to electrically couple the bond-pads 222 to the ball-pads 224 is that this eliminates the need for mounting the imaging die 200 to a separate, larger interposer substrate. The imaging die 200, which has a significantly smaller footprint and profile than the interposer substrate of the conventional device shown in FIG. 1, can define the final footprint of the packaged imager. Accordingly, the imaging die 200 can be used in smaller electronic devices. Furthermore, the imaging die 200 also eliminates having to wire-bond the bond-pads to external contacts. This is useful because wire-bonds tend to break and are difficult to fabricate on high density arrays. Accordingly, the imaging die 200 with the interconnects 226 is more robust than dies that require wire-bonds.

In the embodiment illustrated in FIG. 2, the processing of the imaging die 200 has been completed. As described below, FIGS. 3A-5 illustrate various embodiments of methods for forming interconnects in the imaging die 200. Although the following description illustrates forming one interconnect, it will be appreciated that a plurality of interconnects are constructed simultaneously through a plurality of imaging dies on a wafer.

Figure 3A:
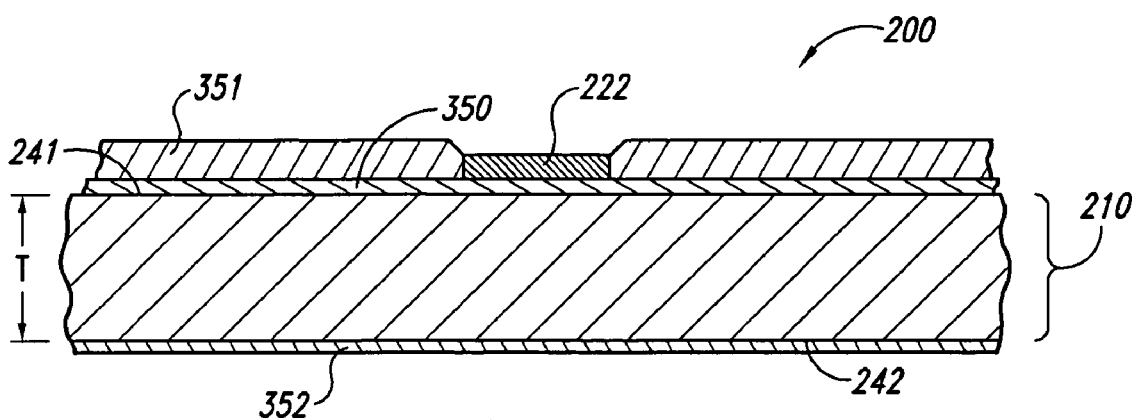
FIGS. 3A-3H are schematic side cross-sectional views illustrating various stages in a method of forming an electrically conductive interconnect through a microelectronic imaging die for providing a backside array of ball-pads in accordance with an embodiment of the invention.

FIGS. 3A-3H schematically illustrate various stages in a method of forming the interconnect 226 in the imaging die 200 in accordance with an embodiment of the invention. FIG. 3A, more specifically, is a schematic side cross-sectional view of the area 3A shown in FIG. 2. In this embodiment, a first dielectric layer 350 is applied to the first side 241 of the substrate 210 and a second dielectric layer 351 is applied over the first dielectric layer 350. A portion of the second dielectric layer 351 over the bond-pad 222 is removed by etching or using another known process to expose the bond-pad 222. The substrate 210 can be thinned by grinding the backside of the substrate 210 to form the second side 242 at a desired thickness "T." The substrate thickness T can be approximately 100 µm-1,000 µm, 300 µm-750 µm, or about 500 µm. The second side 242 of the substrate 210 can be thinned using chemical mechanical planarization (CMP) processes, dry etching processes, chemical etching, chemical polishing, or other suitable grinding procedures.

After the substrate 210 is thinned to a thickness T, a third dielectric layer 352 is applied over the second side 242 of the substrate 210. In one embodiment the first, second, and third dielectric layers 350, 351, 352 are a polyimide material, but these dielectric layers can be other non-conductive materials in other embodiments. For example, the first dielectric layer 350 and/or one or more subsequent dielectric layers can be a low temperature chemical vapor deposition (low temperature CVD) material, such as tetraethylorthosilicate (TEOS), parylene, silicon nitride ($Si_3N_4$), silicon oxide ($SiO_2$), and/or other suitable materials. The dielectric layers 350, 351, 352 are generally not composed of the same material as each other, but it is possible that two or more of these layers are composed of the same material. In addition, one or more of the layers described above with reference to FIG. 3A, or described below with reference to subsequent figures, may be omitted.

Figure 3B:
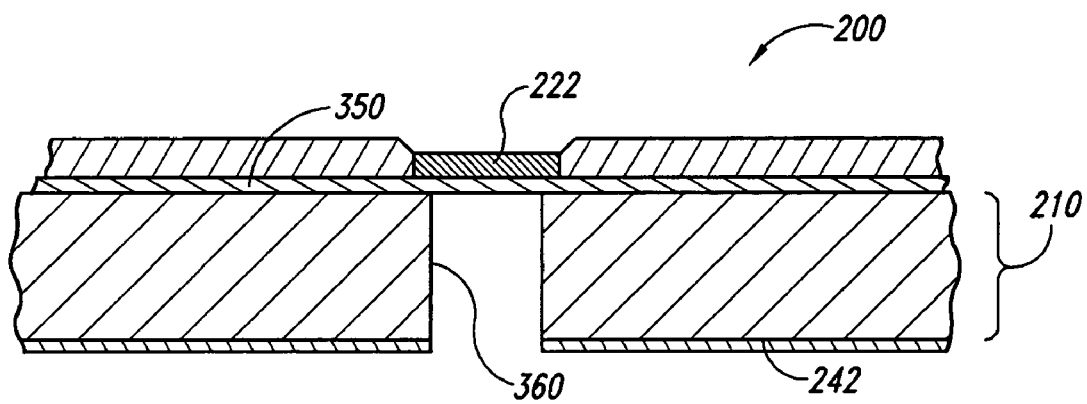

FIGS. 3B-3H are schematic side cross-sectional views similar to FIG. 3A showing the imaging die 200 in subsequent stages of forming the interconnect. FIG. 3B, for example, is a schematic side cross-sectional view of the imaging die 200 after a hole or aperture 360 has been formed through the substrate 210 in alignment with a corresponding bond-pad 222. The hole 360 is formed by patterning the second side 242 of the substrate 210 and etching through the substrate 210 from the second side 242. The hole 360 can be etched using a process that selectively removes material from the substrate 210 compared to the first dielectric layer 350. The first dielectric layer 350 can accordingly be an etch-stop.

Figure 3C:
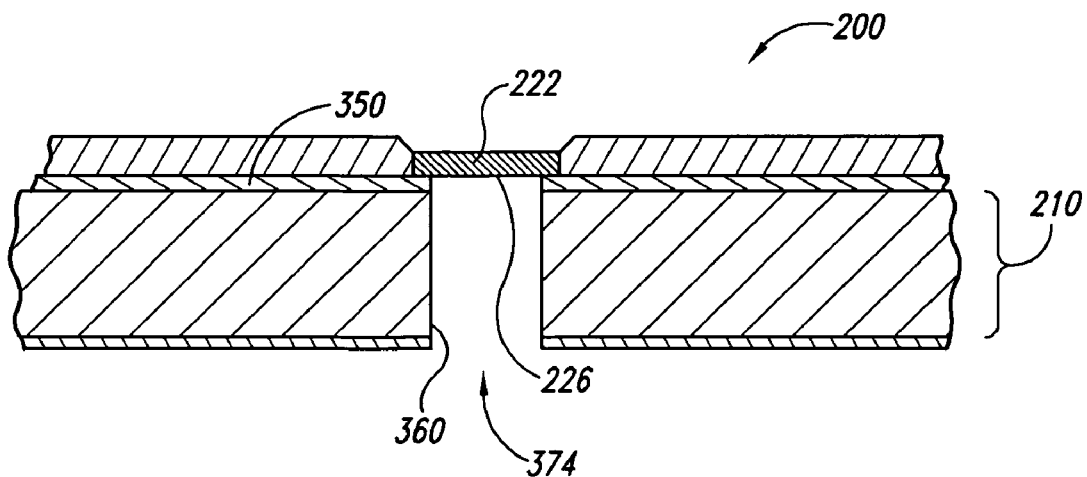

Referring to FIG. 3C, the hole 360 can be extended to the bond-pad 222 by a second etching process that removes the portion of the first dielectric layer 350 directly beneath the bond-pad 222. After the second etching process, at least a portion of a backside 226 of the bond-pad 222 is exposed. The hole 360 and the exposed backside 226 of the bond-pad 222 define a blind hole 374. For purposes of this specification, a "blind hole" refers to a hole or aperture that extends only partially through the imaging die 200. The second etching process used to remove the portion of the first dielectric layer 350 under the bond-pad 222 can be different than the etching process used to form the hole 360 described above with respect to FIG. 3B. For example, the second etch process can selectively remove material from the first dielectric layer 350 at a higher etch rate than from either the substrate 210 or the bond-pad 222. The second etching process accordingly does not alter the general structure of the bond-pad 222 and/or the portion of the hole 360 through the substrate 210. In an alternative embodiment, hole 360 can be formed through both the substrate 210 and the first dielectric layer 350 using a single etching procedure.

The hole 360 can alternatively be formed using a laser in addition to or in lieu of etching. If a laser is used to form all or a portion of the hole 360, it is cleaned using chemical cleaning agents to remove slag or other contaminants. Laser cutting may be advantageous because the substrate 210 does not need to be patterned, but etching processes may be easier because a chemical cleaning process is not required. Another advantage of etching is that the etched hole 360 has rounded corners, which reduces stress points within the hole so that an interconnect constructed within the hole 360 is less susceptible to stress damage.

In addition to etched holes being easier to clean than laser-cut holes, another advantage of etching is that a plurality of holes can be formed simultaneously. The second side 242 of the substrate 210 can be patterned so that apertures in a mask layer are aligned with corresponding bond-pads 222 on the substrate 210. The backside of the substrate 210 can then be etched to simultaneously form a plurality of holes 360 aligned with corresponding bond-pads 222. Accordingly, etching the holes 360 may be more efficient than using a laser because the laser must be realigned with individual bond-pads 222 before it cuts each hole.

Figure 3D:
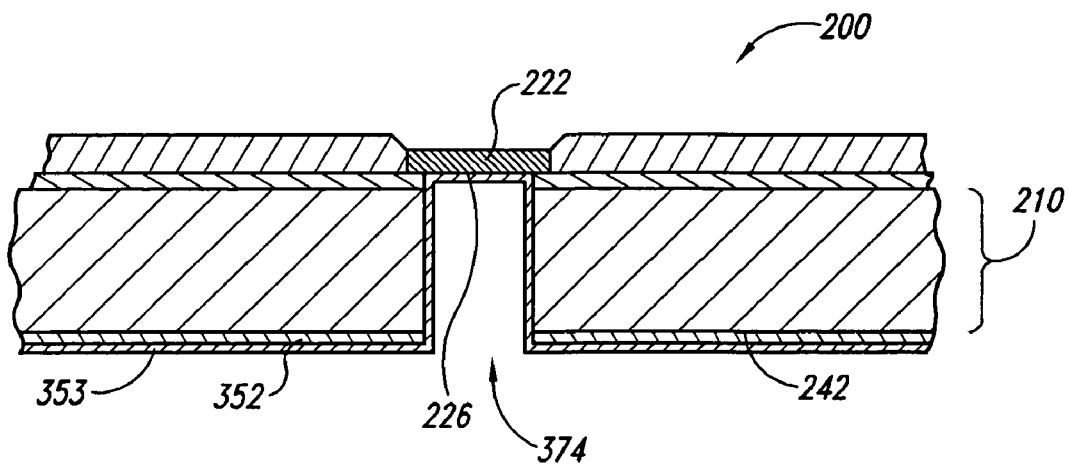

Referring to FIG. 3D, a fourth dielectric layer 353 is applied to the imaging die 200 to cover at least the sidewall of the blind hole 374 in the substrate 210. In the illustrated embodiment the fourth dielectric layer 353 is applied to the second side 242 of the imaging die 200 so that it covers the exposed portions of the substrate 210, the exposed portions of the backside 226 of the bond-pad 222, and the third dielectric layer 352. In one embodiment, the fourth dielectric layer 353 can be a low temperature CVD oxide, but in other embodiments the fourth dielectric layer 353 can be other suitable dielectric materials. The fourth dielectric layer 353 electrically insulates components in the substrate 210 from an interconnect that is subsequently formed in the blind hole 374, as described in greater detail below.

Figure 3E:
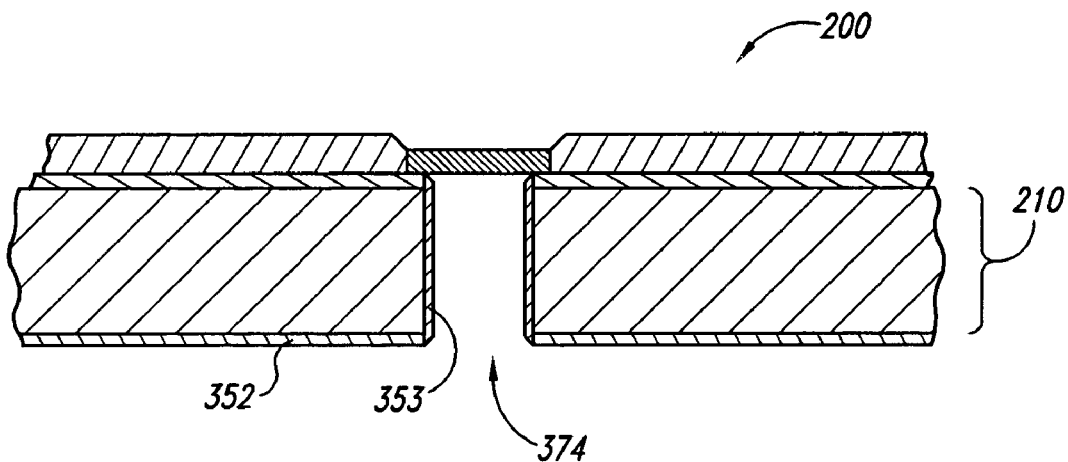

Referring next to FIG. 3E, the portions of the fourth dielectric layer 353 on horizontal and diagonal surfaces of the imaging die 200 are removed. The fourth dielectric layer 353 can be removed from these surfaces by a suitable etching process, such as a dry etch or spacer etch that preferentially removes material from horizontal surfaces and surfaces having horizontal components relative to the direction of the etchant. In other embodiments different processes can be used to remove this layer from the designated surfaces so that a portion of the fourth dielectric layer 353 remains on the sidewalls in the blind hole 374.

Figure 3F:
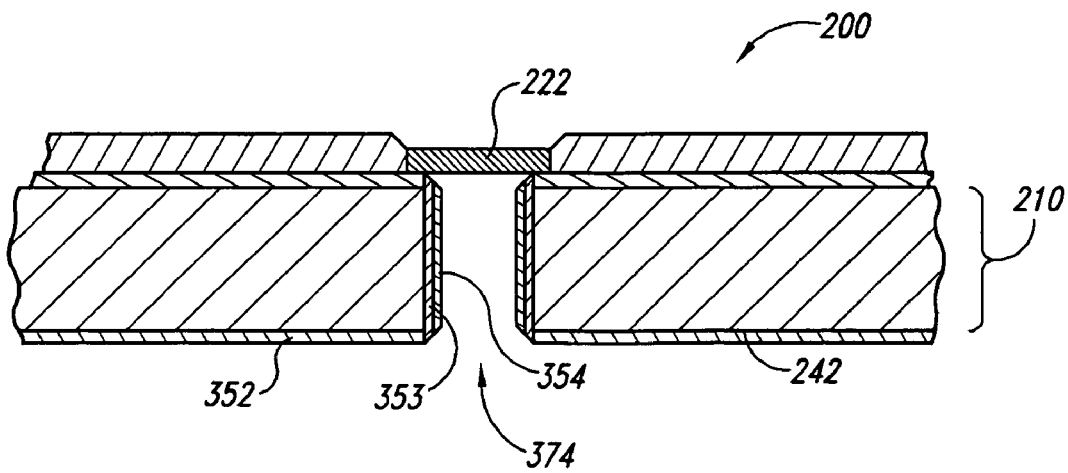

Referring next to FIG. 3F, a first conductive layer 354 is deposited onto the imaging die 200. In the illustrated embodiment, the first conductive layer 354 is deposited onto the second side 242 of the imaging die 200 so that it covers exposed portions of the third dielectric layer 352, the fourth dielectric layer 353, the bond-pad 222, and the substrate 210. The first conductive layer 354 is generally a metal layer, such as a TiN layer, but in other embodiments the first conductive layer 354 can be composed of other suitable materials known to those of skill in the art. When the first conductive layer 354 is composed of TiN, it can be formed using $TiCl_4TiN$ and an atomic layer deposition or chemical vapor deposition process. As explained below, the first conductive layer 354 provides material for plating another layer of metal onto only selected areas of the wafer (e.g., in the hole 360).

Portions of the first conductive layer 354 are then removed from the horizontal and diagonal surfaces of the imaging die 200. In one embodiment, such portions of the first conductive layer 354 are removed from these surfaces by a spacer etch as described above with respect to FIG. 3E. In other embodiments, different processes can be used to selectively remove non-vertical portions of the first conductive layer 354 so that vertical portions of the first conductive layer 354 on the sidewalls in the blind hole 374 remain on the workpiece.

Figure 3G:
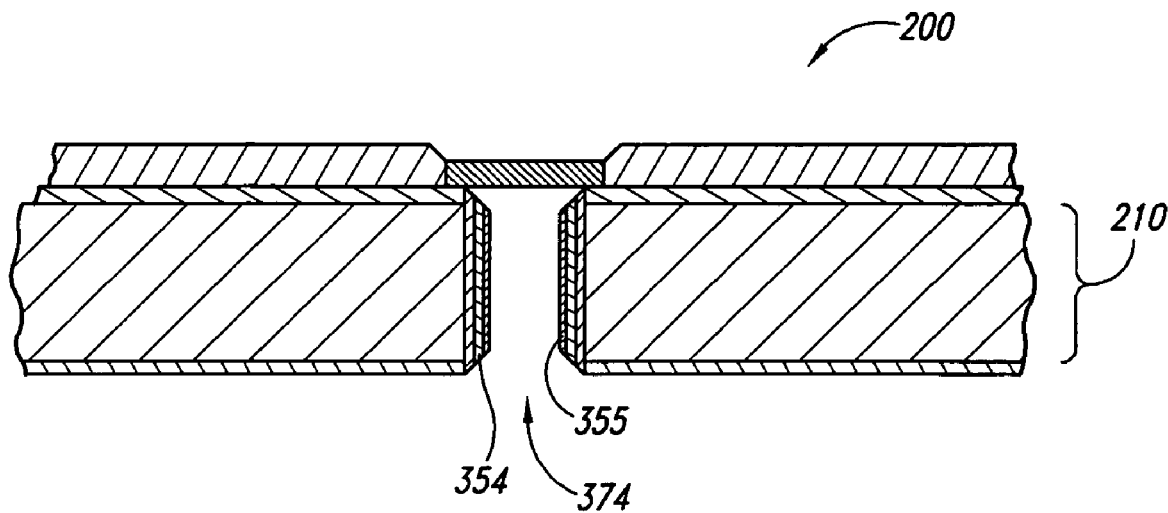

Referring to FIG. 3G, a second conductive layer 355 is applied to the remaining portions of the first conductive layer 354 in the blind hole 374. The second conductive layer 355 can act as a wetting agent to facilitate depositing subsequent metals into the blind hole 374. The second conductive layer 355 can be Ni that is deposited onto a first conductive layer 354 composed of TiN in an electroless plating operation. When the TiN is activated by an HF:Pd wet dip, it provides nucleation for the Ni during the plating process. The plating process may also be performed using an activationless Ni chemistry with reduced stabilizer content. The TiN can enhance the adhesion and electrical properties to induce nucleation. In other embodiments, the blind hole 374 can be coated with Cu or other suitable materials using other methods, or one or more of the first and second conductive layers 354, 355 may be omitted.

Figure 3H:
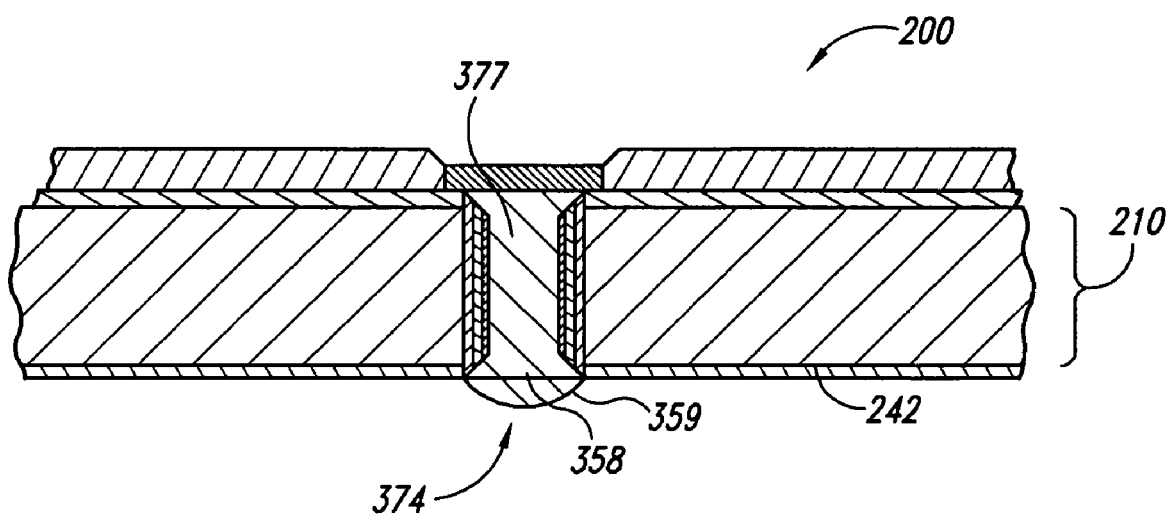

Referring next to FIG. 3H, a conductive fill material 358 is deposited into the blind hole 374 to form an interconnect 377 extending through the imaging die 200. In one aspect of this embodiment, the fill material 358 can be solder, copper, or other electrically conductive fill materials. Various processes can be used to deposit the fill material 358 into the blind hole 374. In one embodiment, the fill material 358 can be deposited into the blind hole 374 using a solder wave process. In other embodiments, the fill material 358 can be deposited by electroplating, electroless plating, or other suitable methods.

A cap 359 can be formed at one end of the interconnect 377 after depositing the fill material 358. The cap 359 electrically couples the interconnect 377 with the bond-pad 222. In one embodiment, the cap 359 can be Ni electroplated onto the interconnect 377. In other embodiments, the cap 359 can be a wetting agent and/or other material. In another aspect of this embodiment, a solder ball (not shown) is attached to the interconnect 377 at the second side 242 of the substrate 210 to provide an external connection to other electronic devices on the backside of the imaging die 200.

Figure 4A:
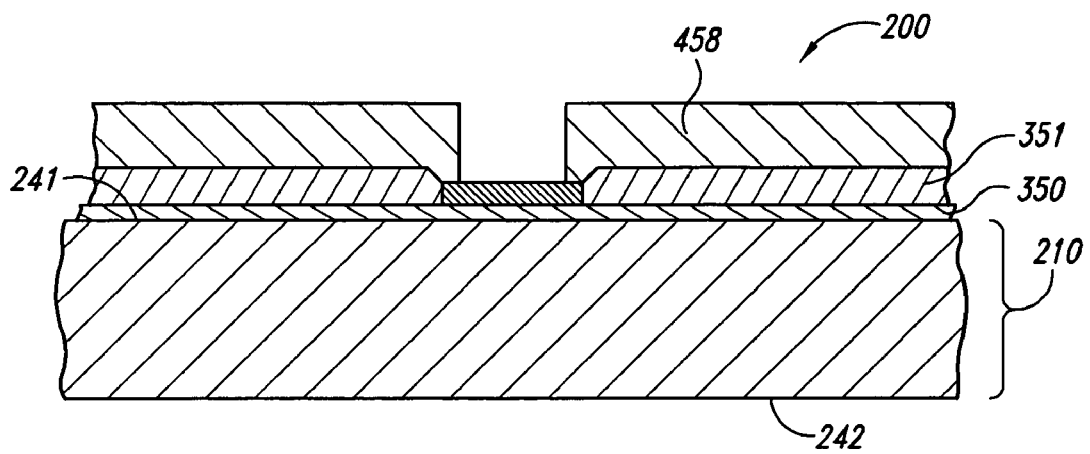
FIGS. 4A-4F are schematic side cross-sectional views illustrating various stages in a method of forming an electrically conductive interconnect through a microelectronic imaging die for providing a backside array of ball-pads in accordance with another embodiment of the invention.

FIGS. 4A-4E illustrate stages in a method of forming a through-wafer interconnect in a imaging die 200 in accordance with another embodiment of the invention. The initial stage of this method is at least generally similar to the steps described above with reference to FIG. 3A, and thus FIG. 4A shows the workpiece configuration illustrated in FIG. 3A. The subsequent steps of this method, however, differ from those described above with reference to FIGS. 3B-3H in that a hole or aperture is formed in the first side 241, as opposed to the second side 242, of the substrate 210. Referring first to FIG. 4A, a mask 458 is applied over the second dielectric layer 351. The mask 458 is formed using suitable materials and methods known to those of skill in the semiconductor processing art. A portion of the mask 458 over the bond-pad 222 is then removed by etching or another known process to expose the bond-pad 222.

Figure 4B:
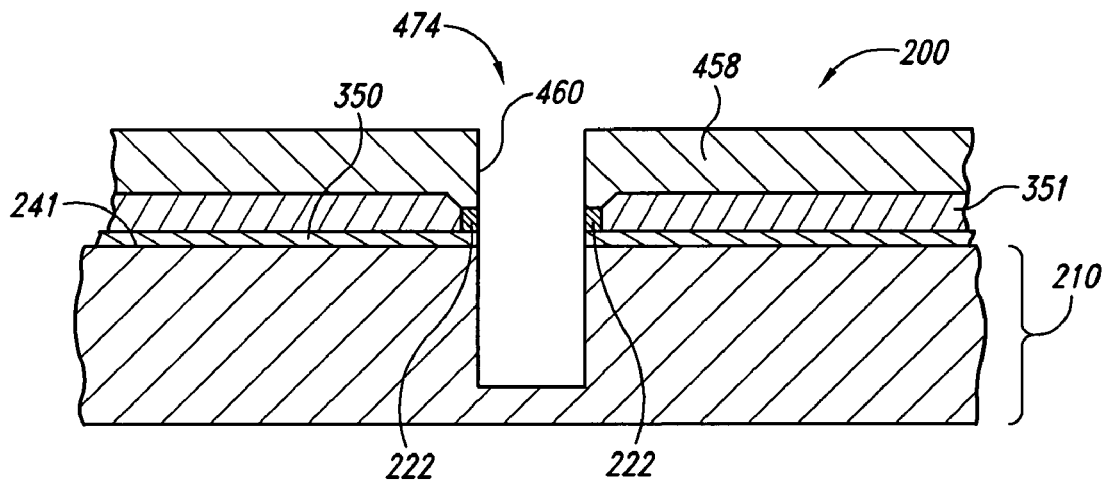

FIG. 4B illustrates forming a hole or aperture 460 at least partially through the substrate 210. The hole 460 extends through the bond-pad 222, the first dielectric layer 350, and at least a portion of the substrate 210 defining a blind hole 474. The hole 460 is formed by an etching process at least generally similar to that described above with respect to FIGS. 3B and 3C. The hole 460 can alternatively be formed using a laser in addition to or in lieu of etching as described above with respect to FIG. 3C.

Figure 4C:
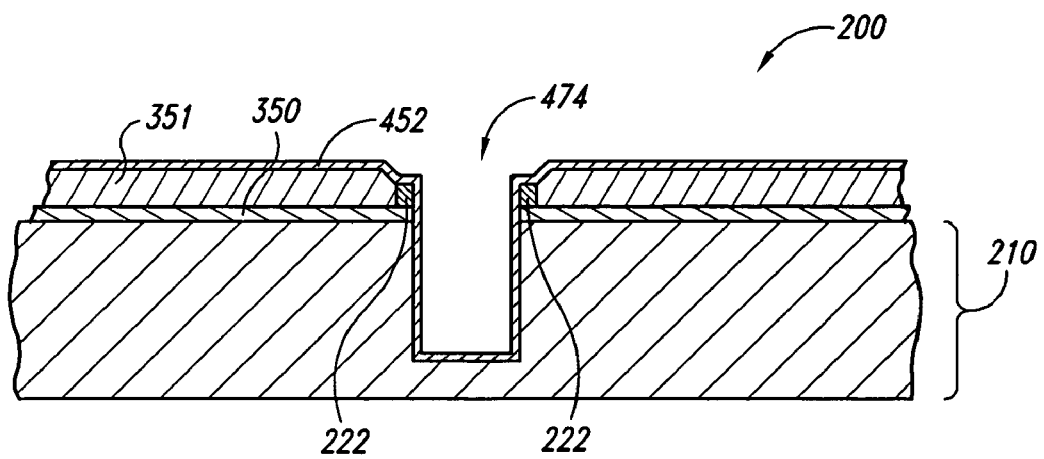

Referring next to FIG. 4C, a third dielectric layer 452 is deposited onto the imaging die 200 to cover the sidewall of the blind hole 474 within the substrate 210. In practice, the third dielectric layer 452 generally covers the second dielectric layer 351 and exposed portions of the bond-pad 222 in addition to the exposed portion of the substrate 210 in the blind hole 474.

Figure 4D:
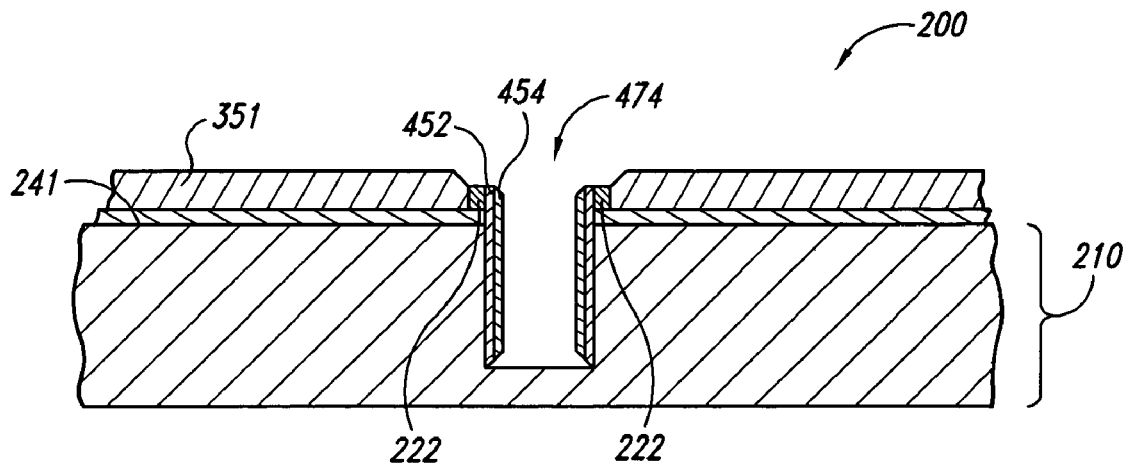

Referring next to FIG. 4D, the portions of the third dielectric layer 452 on the horizontal and diagonal surfaces of the imaging die 200 are then removed to leave portions of the third dielectric layer in the blind hole 474. The portions of the third dielectric layer 452 on the designated surfaces can be removed by another spacer etch. After removing the third dielectric layer 452 from the designated surfaces, a first conductive layer 454 is deposited onto the imaging die 200 to cover the entire third dielectric layer 452 and exposed portions of the substrate 210 within the blind hole 474. As explained above, the first conductive layer can be a TiN layer, but the first conductive layer 454 can be a different material.

After applying the first metal layer 454, a portion of the first conductive layer 454 is removed from the horizontal and diagonal surfaces of the imaging die 200. The first conductive layer 454 can be removed from these surfaces by a spacer etch or other process as described above with respect to FIG. 3E. The spacer etch of the first conductive layer 454 should be terminated before etching through the bond-pad 222.

Figure 4E:
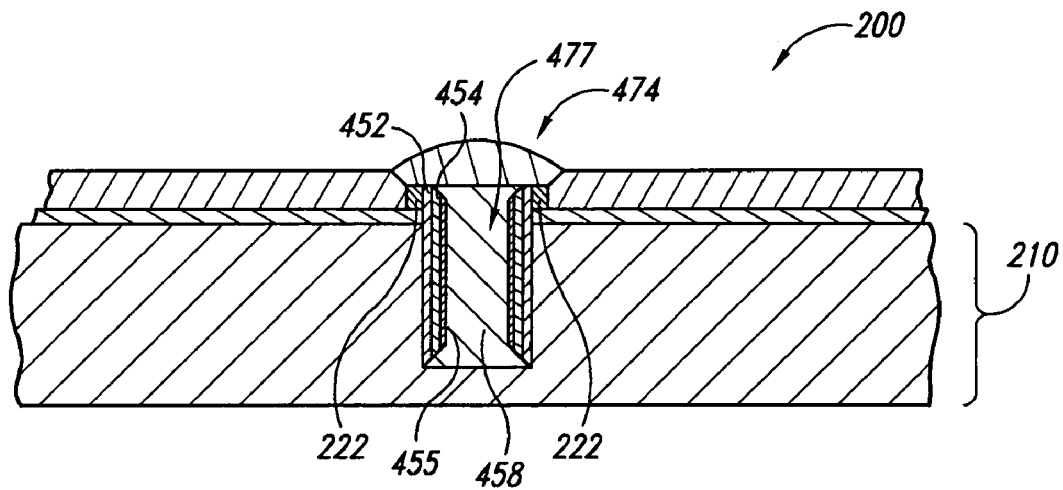

Referring next to FIG. 4E, a second conductive layer 455 is then deposited onto the first metal layer 454. The second conductive layer 455 can be a wetting agent to facilitate filling the blind hole 474 with a conductive fill material. The second conductive layer 455 can be generally similar to the second conductive layer 355 described above with respect to FIG. 3G. After the second conductive layer 455 has been deposited, a portion of the second conductive layer 455 is removed from the horizontal and diagonal surfaces of the imaging die 200 by a spacer etch or other process as described above with respect to FIG. 3E.

A conductive fill material 458 is then deposited into the blind hole 474 to form an interconnect 477 through the imaging die 200. The fill material 458 can include materials as described above with respect to FIG. 3H. In one embodiment, the fill material 458 can be injected into the blind hole 474. In other embodiments, different methods known to those of skill in the art can be used to deposit the fill material 458 into the blind hole 474.

Figure 4F:
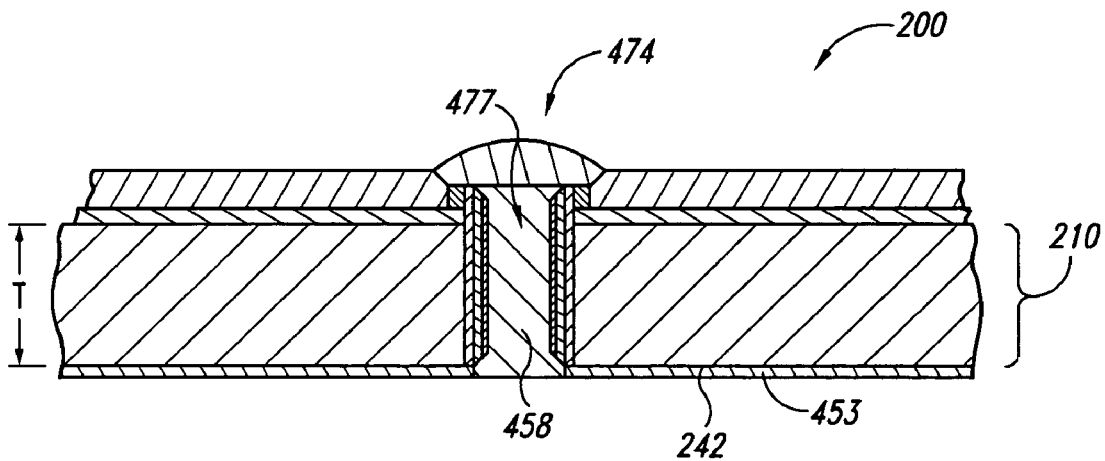

Referring to FIG. 4F, the second side 242 of the substrate 210 is then thinned using a grinding or CMP process as described above. The second side 242 of the substrate 210 is ground to a thickness T until at least a portion of the interconnect 477 is exposed. The substrate thickness T can be approximately 100 μm-1,000 μm, 300 μm-750 μm, or about 500 μm. The substrate thinning process can take place either before or after the fill material 458 is deposited into the blind hole 474. A fourth dielectric layer 453 can then be applied to the second side 242 of the substrate 210 and etched away from the fill material 458 to expose a portion of the interconnect 477.

Figure 5:
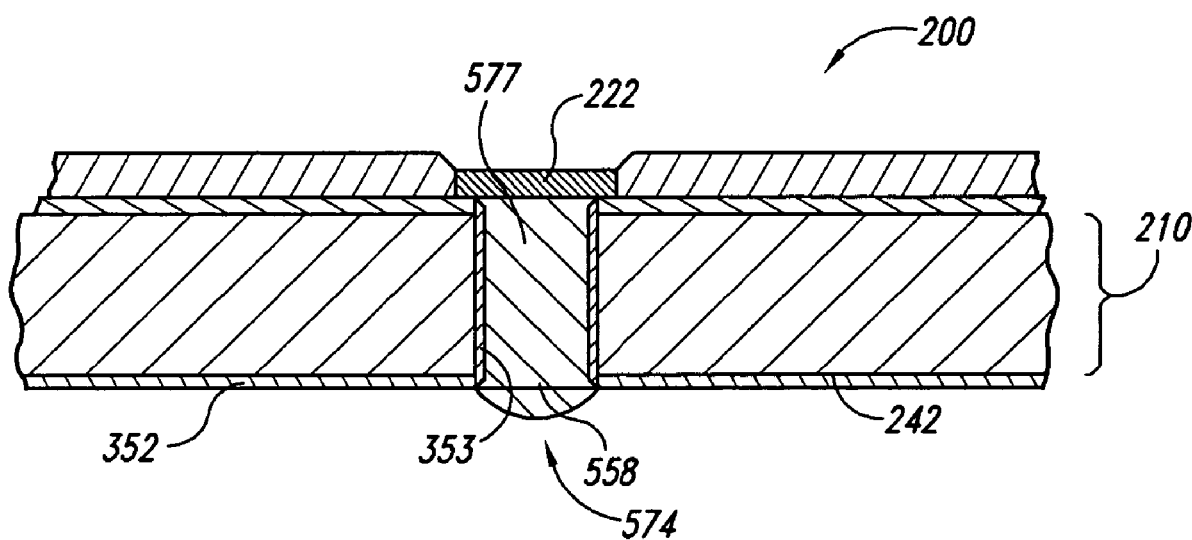
FIG. 5 is a schematic side cross-sectional view illustrating a stage in a method of forming an electrically conductive interconnect through a microelectronic imaging die for providing a backside array of ball-pads in accordance with another embodiment of the invention.

FIG. 5 illustrates a stage in a method of forming an interconnect in a imaging die 200 in accordance with another embodiment of the invention. The first part of this method is at least generally similar to the steps described above with reference to FIGS. 3A-3E. The subsequent stages of this method, however, differ from those described above with reference to FIGS. 3F-3H in that a first conductive layer and a second conductive layer are not deposited into the blind hole 574. Instead, a conductive fill material 558 is plated into the blind hole 574 using a bottom-up plating process. The plating process can be an electroless or an electrolytic process. In an electrolytic process, for example, a conductive member is pressed against the upper side of the bond-pad 222 while the lower side of the bond-pad 222 contacts a plating solution. A potential is applied between the conductive member and the plating solution to plate ions in the solution onto the backside of the bond-pad 222. The ions will continue to plate onto each other in a bottom-up manner until the fill material 558 fills the hole 574. The imaging die 200 is then removed from the plating bath and the fill material 558 remains in the blind hole 574 thus forming the interconnect 577. After the interconnect 577 has been formed, the imaging die 200 can undergo additional packaging steps that are at least generally similar to those described above with reference to FIG. 3H.

The embodiments described above with reference to FIGS. 3A-5 include three methods for forming and/or filling blind holes that partially extend through substrates in microelectronic imaging dies, but other methods can be used to form and/or fill such blind holes in additional embodiments. Accordingly, the present invention is not limited to the particular methods for forming and/or filling the blind holes described above, but it also includes alternative methods for providing an electrically conductive material in a blind hole to form an array of ball-pads on the backside of the imager die.

C. Microelectronic Imagers with Through-Wafer Interconnects

Figure 6:
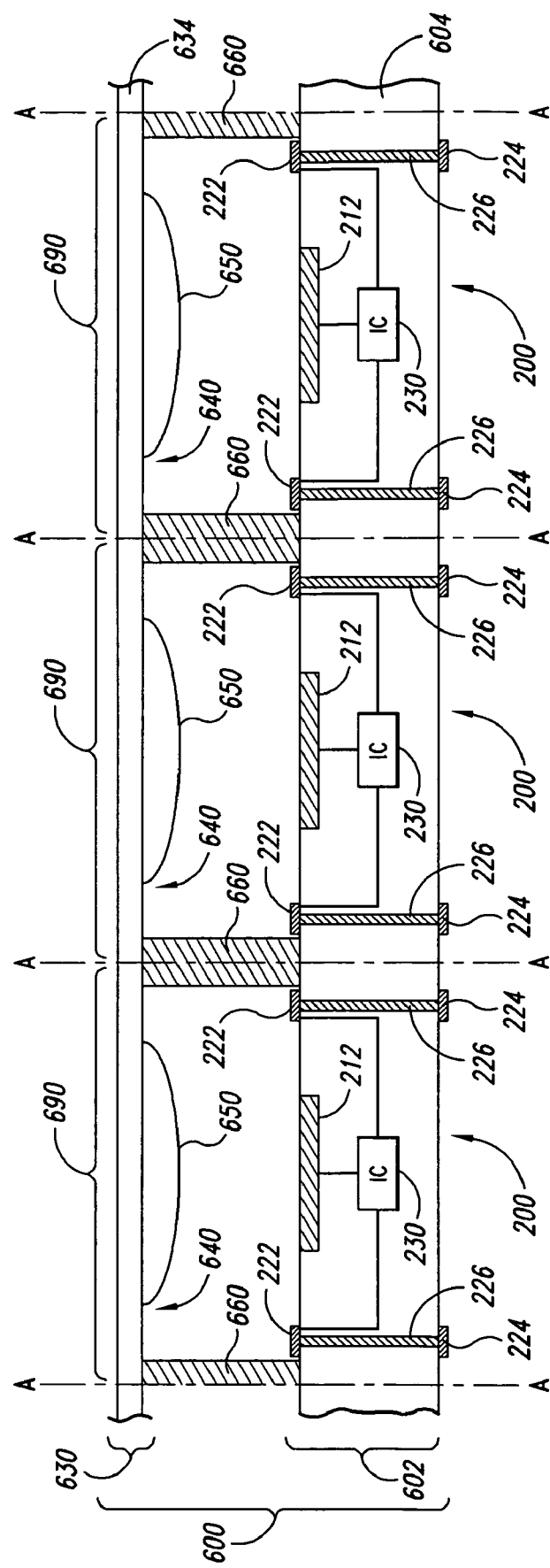
FIG. 6 is a schematic side cross-sectional view of an assembly including a microelectronic workpiece having a plurality of imaging dies and an optics workpiece having a plurality of optics units in accordance with an embodiment of the invention.

FIG. 6 is a schematic cross-sectional view of an assembly 600 including a plurality of microelectronic imagers 690 that each include an imaging die 200 and an optics unit 640. The assembly 600 includes a microelectronic imager workpiece 602 having a first substrate 604 and a plurality of imaging dies 200 formed on the first substrate 604. The individual imaging dies 200 can be generally similar to the imaging die 200 described above with respect to FIG. 2; like reference numbers accordingly refer to like components in FIGS. 2 and 6. The assembly 600 also includes an optics workpiece 630 that includes a second substrate 634 and a plurality of optics units 640 on the second substrate 634. Individual optic units 640 can include an optic member 650 on the second substrate 634. The optic member 650 can include lenses and/or filters for focusing and filtering the radiation passing through the optics unit 640.

The assembly 600 further includes a plurality of stand-offs 660 configured to position individual optic units 640 with respect to individual image sensors 212. Suitable stand-offs are disclosed in U.S. patent application Ser. No. 10/723,363, entitled "Packaged Microelectronic Imagers and Methods of Packaging Microelectronic Imagers," filed on Nov. 26, 2003, which is incorporated by reference herein. The microelectronic imagers 690 can be assembled by seating the stand-offs 660 so that the optics units 640 are accurately aligned with the image sensors 212. In one embodiment, the stand-offs 660 are seated before singulating the individual imagers 690 such that all of the microelectronic imagers are assembled at the wafer level. Both of the first and second substrates 604 and 634 can then be cut along lines A-A to separate individual imagers 690 from each other.

One advantage of the assembly 600 of microelectronic imagers 690 illustrated in FIG. 6 is that the through-wafer interconnects 226 enable a plurality of microelectronic imagers to be fabricated at the wafer level using semiconductor fabrication techniques. Because the through-wafer interconnects 226 provide an array of ball-pads 224 on the backside of the imaging dies 200, it is not necessary to wire-bond the bond-pads 222 on the front side of the wafer to external devices. The bond-pads 222 can accordingly be covered at the wafer level. This enables the process of (a) fabricating a plurality of imaging dies 200 at the wafer level on one substrate, (b) fabricating a plurality of optics units 640 at the wafer level on another substrate, and (c) assembling a plurality of optic units 640 with a corresponding plurality of imaging dies 200 at the wafer level using automated equipment. Therefore, the microelectronic imagers 690 with through-wafer interconnects 226 enable processes that significantly enhance the throughput and accuracy of packaging microelectronic imagers.

Another advantage of the assembly 600 of microelectronic imagers 690 is the ability to decrease the real estate that the imagers 690 occupy in a cell phone, PDA, or other type of device: Because the imagers 690 do not require an interposer substrate to provide external electrical contacts in light of the through-wafer interconnects 226, the footprint of the imagers 690 can be the same as that of the die 200 instead of the interposer substrate. The area occupied by the imagers 690 is accordingly less than conventional imagers because the footprint of the individual imaging dies 200 is significantly smaller than that of the interposer substrate. Furthermore, because the dies 200 provide a backside array of ball-pads 224 that can be coupled directly to a module without an interposer substrate, the profile is lower and the time and costs associated with mounting the die to the interposer substrate are eliminated. This results in greater throughput, lower packaging costs, and smaller imagers.

A further advantage of wafer-level imager packaging is that the microelectronic imagers 690 can be tested from the backside of the dies 200 at the wafer level before the individual imagers 690 are singulated. A test probe can contact the backside of the dies 200 to test the individual microelectronic imagers 690 because the through-wafer interconnects 226 provide backside electrical contacts. Accordingly, because the test probe engages contacts on the backside of the imager workpiece 602, it will not damage the image sensors 212, the optics units 640, or associated circuitry on the front of the microelectronic imagers 690. Moreover, the test probe does not obstruct the image sensors 212 during a backside test, which allows the test probe to test a larger number of dies at one time compared to processes that test imaging dies from the front side. As such, it is more efficient in terms of cost and time to test the microelectronic imagers 690 at the wafer level (i.e., before singulation) than to test each imager 690 from the front side of the dies 200. Furthermore, it is advantageous to test the microelectronic imagers 690 in an environment where the individual image sensors 212 and/or optics units 640 will not be damaged during testing.

Yet another advantage of wafer-level processing is that the microelectronic imagers 690 can be singulated after assembling the optics units 640 to the dies 200. The attached optics units 640 protect the imager sensors 212 on the front side of the dies 200 from particles generated during the singulation process. Thus, the likelihood that the image sensors 212 or associated circuitry on the front side of the dies 200 will be damaged during singulation and subsequent handling is significantly reduced.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

We claim:

1. A packaged microelectronic imaging die, comprising:
   a microelectronic substrate having a first side, a second side opposite the first side, an image sensor, and an integrated circuit electrically coupled to the image sensor;
   a terminal carried by the substrate and electrically coupled to the integrated circuit; and
   an electrically conductive interconnect extending through at least a portion of the substrate and contacting the terminal, wherein the interconnect does not extend completely through the terminal;
   wherein the substrate includes a hole extending from the second side of the substrate to the terminal, and wherein the hole does not extend through the terminal; and the interconnect comprises:
      a dielectric liner disposed within at least a portion of the hole and in contact with the substrate,
      a first conductive layer disposed over at least a portion of the dielectric liner,
      a second conductive layer disposed over at least a portion of the first conductive layer, and
      a conductive fill material disposed in the hole over at least a portion of the second conductive layer and electrically coupled to the terminal.

2. A packaged microelectronic imaging die, comprising:
a microelectronic substrate having a first side, a second side opposite the first side, an image sensor, and an integrated circuit electrically coupled to the image sensor;
a terminal carried by the substrate and electrically coupled to the integrated circuit; and
an electrically conductive interconnect extending through at least a portion of the substrate and contacting the terminal, wherein the interconnect does not extend completely through the terminal;
wherein the substrate includes a hole extending from the second side of the substrate to the terminal, and wherein the hole does not extend through the terminal; and
the interconnect comprises:
- a dielectric liner disposed on the sidewalls of the hole and in contact with the substrate,
- a conductive layer over at least a portion of the dielectric liner, the conductive layer including TiN,
- a wetting agent over at least a portion of the conductive layer and the terminal, the wetting agent including one or both of Ni and Cu, and
- a metal fill disposed in the hole over at least a portion of the wetting agent and electrically coupled to the terminal.

3. A packaged microelectronic imaging die, comprising:
a microelectronic substrate having a first side, a second side opposite the first side, an image sensor, and an integrated circuit electrically coupled to the image sensor;
a terminal carried by the substrate and electrically coupled to the integrated circuit; and
an electrically conductive interconnect extending through at least a portion of the substrate and contacting the terminal, wherein the interconnect does not extend completely through the terminal;
wherein the substrate includes a hole extending from the second side of the substrate to the terminal, and wherein the hole does not extend through the terminal; and
the interconnect comprises:
- a dielectric liner disposed on the sidewalls of the hole and in contact with the substrate, and
- a metal fill disposed in the hole over at least a portion of the dielectric liner and electrically coupled to the terminal.

* * * * *